(12) United States Patent
Li et al.

(10) Patent No.: US 9,136,469 B2
(45) Date of Patent: Sep. 15, 2015

(54) PHASE CHANGE MEMORIES (71) Applicant: Semiconductor Manufacturing International (Shanghai) Corporation, Shanghai (CN)

(72) Inventors: Ying Li, Shanghai (CN); Neil Zhu, Shanghai (CN); Guanping Wu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/642,573

(22) Filed: Mar. 9, 2015

(65) Prior Publication Data
US 2015/0188038 A1 Jul. 2, 2015

Related U.S. Application Data (62) Division of application No. 14/056,253, filed on Oct. 17, 2013, now Pat. No. 9,006,022.

(30) Foreign Application Priority Data

Dec. 4, 2012 (CN) .......................... 2012 1 0513905

(51) Int. Cl.
*H01L 21/06* (2006.01)
*H01L 45/00* (2006.01)

(52) U.S. Cl.
CPC .............. *H01L 45/06* (2013.01); *H01L 45/124* (2013.01); *H01L 45/1233* (2013.01); *H01L 45/1253* (2013.01); *H01L 45/144* (2013.01); *H01L 45/1683* (2013.01)

(58) Field of Classification Search
CPC .......... H01L 27/24; H01L 21/06; G11C 11/21
USPC ................. 257/4, E45.002, E21.52; 438/102; 365/148
See application file for complete search history.

(56) References Cited

U.S. PATENT DOCUMENTS

| | | | |
|---|---|---|---|
| 6,764,894 B2 * | 7/2004 | Lowrey ........................ | 438/238 |
| 7,812,332 B2 * | 10/2010 | Oh et al. ............................ | 257/3 |
| 7,939,366 B2 * | 5/2011 | Song et al. ....................... | 438/102 |
| 8,039,829 B2 * | 10/2011 | Park et al. ......................... | 257/4 |
| 2005/0139816 A1 * | 6/2005 | Jeong et al. ........................ | 257/2 |
| 2005/0250316 A1 * | 11/2005 | Choi et al. ..................... | 438/637 |
| 2008/0160687 A1 * | 7/2008 | Kim .............................. | 438/244 |
| 2008/0316793 A1 * | 12/2008 | Philipp et al. .................. | 365/148 |
| 2009/0026436 A1 * | 1/2009 | Song et al. ......................... | 257/3 |

(Continued)

*Primary Examiner* — Caleb Henry
(74) *Attorney, Agent, or Firm* — Anova Law Group, PLLC (57) ABSTRACT

A method is provided for fabricating a phase change memory. The method includes providing a semiconductor substrate having a bottom electrode connecting with one or more semiconductor devices, and forming a first dielectric layer on the semiconductor substrate. The method also includes forming a loop-shape electrode in the first dielectric layer, and forming a second dielectric layer having a first opening exposing a portion of the first dielectric layer and a portion of the loop-shape electrode. Further, the method includes forming a phase change layer in the first opening of the second dielectric layer such that a contact area between the phase change layer and the loop-shape electrode may be controlled to achieve desired contact, and forming a top electrode.

20 Claims, 8 Drawing Sheets

(56) References Cited

U.S. PATENT DOCUMENTS

| | | | |
|---|---|---|---|
| 2009/0032793 A1* | 2/2009 | Lai et al. | 257/4 |
| 2009/0236583 A1 | 9/2009 | Kuo et al. | |
| 2010/0003794 A1* | 1/2010 | Jin et al. | 438/253 |
| 2010/0051896 A1* | 3/2010 | Park et al. | 257/4 |
| 2012/0091428 A1* | 4/2012 | Miyata | 257/5 |
| 2012/0129314 A1* | 5/2012 | Liao et al. | 438/386 |
| 2013/0102150 A1* | 4/2013 | Oh et al. | 438/667 |
| 2013/0249113 A1* | 9/2013 | Baba | 257/776 |

\* cited by examiner

PHASE CHANGE MEMORIES

CROSS REFERENCE TO RELATED APPLICATIONS

This application is a divisional of U.S. patent application Ser. No. 14/056,253, filed on Oct. 17, 2013, which claims priority to Chinese Patent Application No. 201210513905.X, filed on Dec. 4, 2012, all of which are incorporated herein by reference in their entirety.

FIELD OF THE INVENTION

The present invention generally relates to the field of semiconductor manufacturing technology and, more particularly, relates to phase change memories and fabrication techniques.

BACKGROUND

With the development of information technology, especially with the popularization of cell phones, digital cameras, music players and other potable electronics, non-volatile memories have impacted many aspects of modern life. As a typical non-volatile memory, a flash memory has gained intensive development in past tens of years. When the semiconductor technology enters in a 22 nm technology node, the flash memory technology based on a floating-gate has encountered some difficulties. Therefore, phase change memories (PCMs) have become a hot topic of the non-volatile memories because of their superiorities in many aspects, such as unit area, writing/reading speed, writing/reading times, and data storage time.

Figure 1:
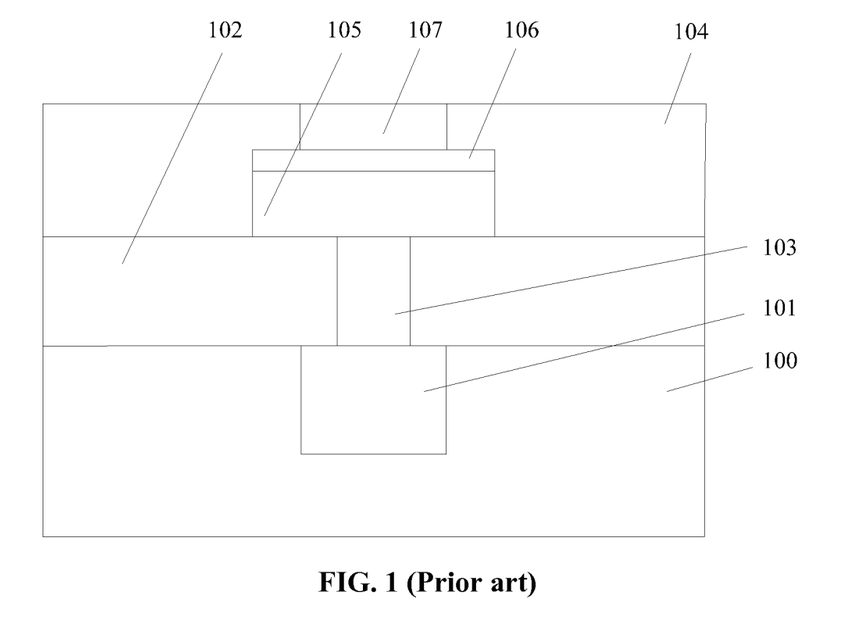
FIG. 1 illustrates the structure of an existing phase change memory.

FIG. 1 illustrates a structure of an existing PCM. The PCM includes a semiconductor substrate 100 containing semiconductor devices, or semiconductor devices and metal interconnection structures; a bottom electrode 101 leveling with one surface of the semiconductor substrate 100 and electrically connecting with the semiconductor devices or the metal interconnection structures in the semiconductor substrate 100; a first dielectric layer 102; a small electrode 103 with a cross section area smaller than a cross-section area of the bottom electrode 101 and electrically connecting with the bottom electrode 101 and leveling with one surface of the first dielectric layer 102; a phase change material layer 105 on the first dielectric layer 102; a transitional metal layer 106 having functions of adhesion and heat isolation on the phase change material layer 105; a top electrode 107 electrically connecting with an external circuit, and a second dielectric layer 104 covering the phase change material layer 105, the transitional metal layer 106 and the top electrode 107. The second dielectric layer 104 levels with one surface of the top electrode 107.

When a PCM is functioning, the semiconductor devices in the semiconductor substrate 100 supplies an electrical current, the electrical current flows through the bottom electrode 101, the small electrode 103, the phase change material layer 105, the transitional metal layer 106 and the top electrode 107, thus a joule heat is generated. The phase change material 105 is heated, which causes a phase change to happen in a portion of the phase change material 105 on the top of the small electrode 103, i.e., the crystal phase changes from crystalline to amorphous. The principle of the PCM is to use resistances of the crystalline state and the amorphous state to record data.

The phase change material 105 may need to be heated to a melting temperature and quenched to change the phase from crystalline to amorphous, thus a relatively larger current is required. Therefore, the power consumption of the existing PCMs is high. The disclosed methods and systems are directed to solve one or more problems set forth above and other problems.

BRIEF SUMMARY OF THE DISCLOSURE

One aspect of the present disclosure includes a method for fabricating a phase change memory. The method includes providing a semiconductor substrate having a bottom electrode connecting with one or more semiconductor devices, and forming a first dielectric layer on the semiconductor substrate. The method also include forming a loop-shape electrode in the first dielectric layer, and forming a second dielectric layer having a first opening exposing a portion of the first dielectric layer and a portion of the loop-shape electrode. Further, the method includes forming a phase change layer in the first opening of the second dielectric layer such that a contact area between the phase change layer and the loop-shape electrode may be controlled to achieve desired contact, and forming a top electrode.

Another aspect of the present disclosure includes a phase change memory. The phase change memory includes a semiconductor substrate having a bottom electrode inside and a first dielectric layer on one surface, and a loop-shape electrode in the first dielectric layer electrically connecting with the bottom electrode. The phase change memory also includes an isolation structure on a portion of the surface of the first dielectric layer covering a portion of the loop-shape electrode, and a second dielectric layer covering a portion of the loop-shape electrode and a portion of the isolation structure. Further, the phase change memory includes a phase change layer on the second dielectric layer covering a portion of the loop-shape electrode and a portion of the isolation structure, and a contact metal layer on the phase change layer. Further, the phase change memory also includes a fourth dielectric layer, and a top electrode.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In the existing PCM, as shown in FIG. 1, the phase chase material layer 105 is formed on the small electrode 103, thus a contact area of the phase change material layer 105 and the small electrode 103 may be determined by a size of the small electrode 103. When the PCM is functioning, a phase change region in the phase change material layer 105, the region in which the phased change material changes from crystalline to amorphous, determines a power consumption of the PCM. An existing method for forming the PCM is limited by a photo lithography process, that is, the size of the small electrode 103 may be still relatively large, the contact area of the small electrode 103 and the phase change material layer 105 may be relatively large too. The relatively large contact area may cause the phase change region in the phase change material layer 105 to be relatively large, and the power consumption of the PCM may be relatively high.

Figure 14:
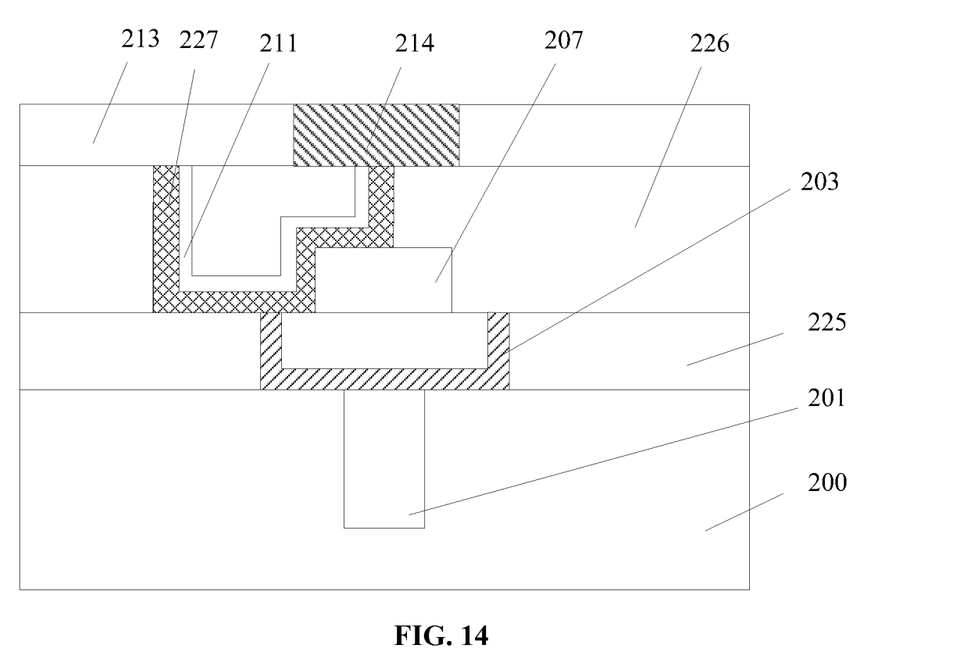
Figure 15:
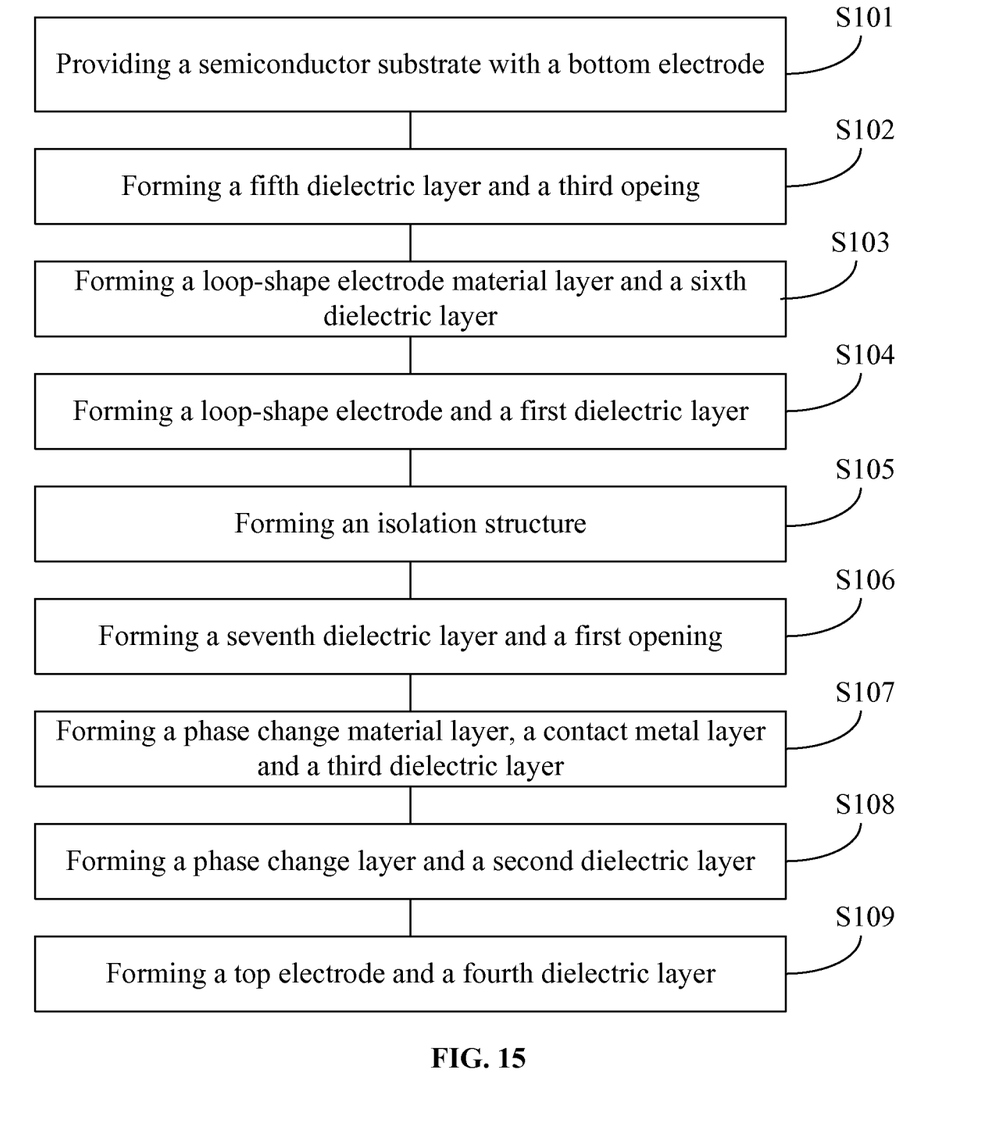
FIG. 15 illustrates an exemplary fabrication process of a phase change memory consistent with the disclosed embodiments.

FIG. 15 illustrates an exemplary fabrication process of a PCM consistent with the disclosed embodiments. FIGS. 2-14 illustrate the semiconductor structures corresponding to certain stages of the exemplary fabrication process.

Figure 2:
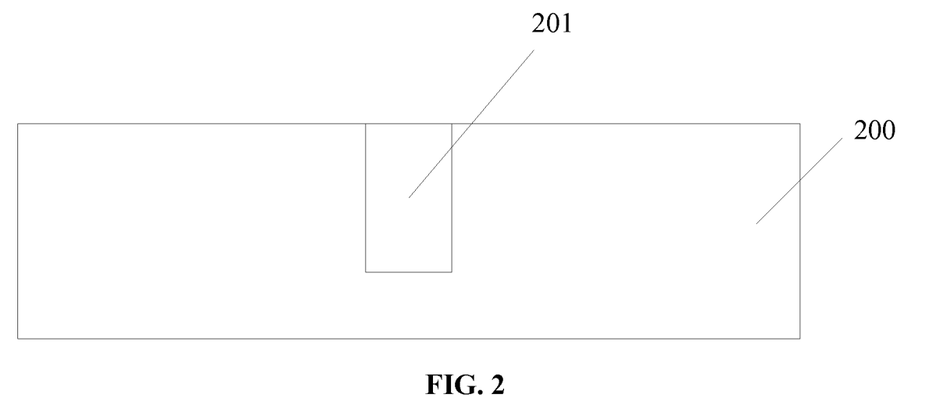
FIGS. 2-14 illustrate semiconductor structures corresponding to certain stages of an exemplary fabrication process of a phase change memory consistent with the disclosed embodiments.

As shown in FIG. 15, at the beginning of the fabrication process, a semiconductor substrate with certain structures is provided (S101). FIG. 2 illustrates a corresponding semiconductor device.

As shown in FIG. 2, a semiconductor substrate 200 is provided. The semiconductor substrate 200 may include any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, epitaxially grown materials, and silicon on insulator (SOI), etc. In one embodiment, the semiconductor substrate 200 is single crystalline silicon. The semiconductor substrate 200 may also provide a base for subsequent processes and structures.

After providing the semiconductor substrate 200, although not shown, semiconductor devices and/or interconnection structures of semiconductor devices and metals may be formed in the semiconductor substrate 200. The semiconductor devices may be one or more of MOS transistor, diode, memory, capacitor, resistor, inductor, micro/nano heater, and MEMS, etc. Metal connection may be formed on the semiconductor devices to electorally connect with later formed structures and/or devices. In one embodiment, the semiconductor devices are transistors which may supply a voltage and/or current to subsequently formed structures and devices.

After forming the semiconductor devices, a bottom electrode 201 may be formed, and the bottom electrode 201 may connect with the semiconductor devices. The bottom electrode 201 may be isolated from the semiconductor substrate 200 by an isolation layer (not shown). The bottom electrode 201 may be made of any appropriate material, such as copper, aluminum, gold, tungsten, titanium, or doped silicon, etc. In one embodiment, the bottom electrode 201 is made of tungsten. The isolation layer may be made of any appropriate material, such as silicon oxide, silicon nitride, or silicon oxynitride, etc. In one embodiment, the isolation layer is made of silicon oxide.

The semiconductor devices my be formed by any appropriate method. The bottom electrode 201 may be formed by one or more of a chemical vapor deposition (CVD) process, a physical vapor deposition (PVD) process, an electroplating process, or an atomic layer deposition (ALD) process, etc. The isolation layer may be formed by various processes, such as a CVD process, a PVD process, an ALD process, or a thermal oxidation process. One surface of the bottom electrode 201 may level with a top surface of the semiconductor substrate 200.

Returning to FIG. 15, after providing the semiconductor substrate 200 and forming the bottom electrode 201, a fifth dielectric layer and a third opening may be formed (S102). A corresponding semiconductor structure is illustrated in FIG. 3.

Figure 3:
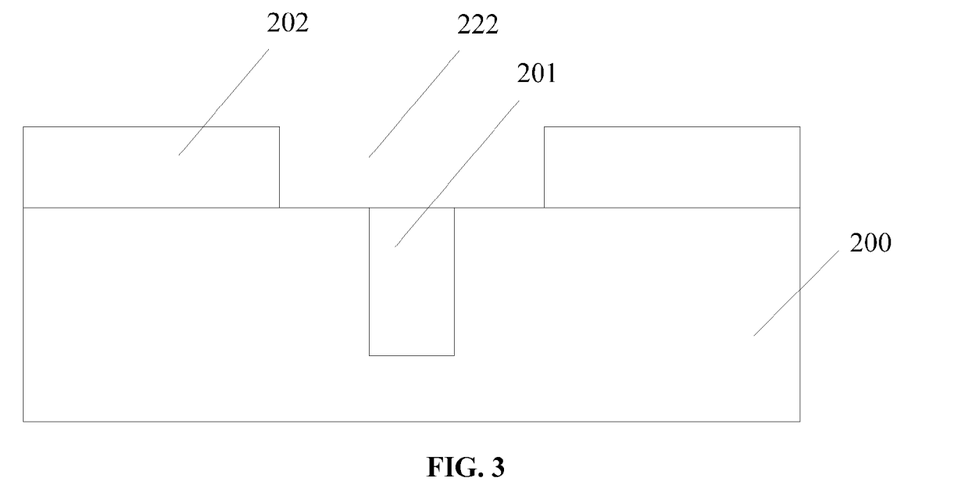

As shown in FIG. 3, after forming the bottom electrode 201, a fifth dielectric layer 202 may be formed on one surface of the semiconductor substrate 200 and one surface of the bottom electrode 201. Further, a portion of the fifth dielectric layer 202 is removed and a third opening 222 is formed in a fifth dielectric layer 202. The bottom electrode 201 is exposed by the third opening 222. The fifth dielectric layer 202 may be made of any appropriate material, such as silicon oxide, silicon nitride, silicon oxynitride, or a combination thereof. Various processes may be used to form the fifth dielectric layer, such as a CVD process, a PVD process, an ALD process, or a pulse laser deposition (PLD) process, etc.

After forming the fifth dielectric layer 202, the third opening 222 may be formed by etching the fifth dielectric layer 202. A process for forming the third opening 202 may include forming a photo resist layer on the fifth dielectric layer 202 (not shown), and forming a fourth opening exposing a portion of the fifth dielectric layer 202 in the photo resist layer (not shown), a position of the fourth opening may be corresponding to the bottom electrode 201. The method for forming the third opening 222 may also include etching the fifth dielectric layer 202 using the photo resist layer having the forth opening as a mask until the surface of the semiconductor substrate 200 and the surface of the bottom electrode 201 are exposed, and removing the photo resist layer. The fifth dielectric layer 202 may be etched by any appropriate process, such a plasma etching process, an ion beam etching process, or a wet chemical etching process, etc.

Figure 4:
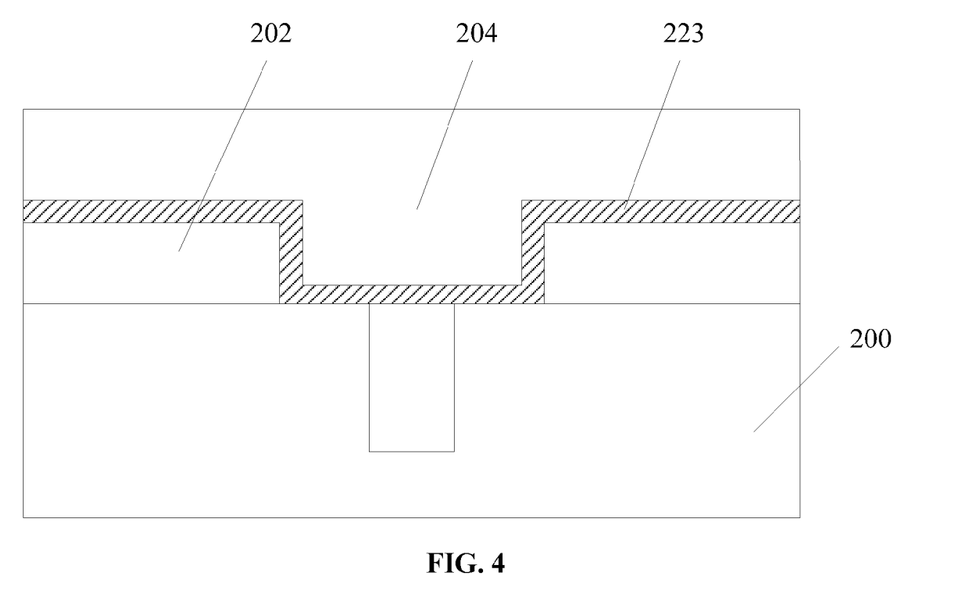

Returning to FIG. 15, after forming the third opening 222, a loop-shape electrode material layer and a sixth dielectric layer may be formed (S103). FIG. 4 illustrates a corresponding semiconductor structure.

As shown in FIG. 4, a loop-shape electrode material layer 223, which may be used to subsequently form a loop-shape electrode, is formed, and the loop-shape electrode material layer 223 may cover the bottom and the sidewall of the third opening 222. A thickness of the loop-shape electrode material layer 223 may be smaller than a depth of the third opening 222. The loop-shape electrode material layer 223 may be made of any appropriate material, such as aluminum, copper, silver, gold, platinum, nickel, titanium, thallium, tantalum, tungsten, tungsten silicide, titanium tungsten alloy, titanium nitride, thallium nitride, thallium carbide, nickel platinum alloy, or thallium nitrate silicate etc. In one embodiment, the loop-shape material 223 is tungsten. Various processes may be used to form the loop-shape electrode material layer 223, such as a CVD process, a PVD process, an ALD process, or a PLD process, etc.

Referring to FIG. 4, alter forming the loop-shape material layer 223, a sixth dielectric layer 204 may be formed on the loop-shape material layer 223. A thickness of the sixth dielectric layer 204 is greater than a depth of the third opening 222. The sixth dielectric layer 204 may be made of any appropriate material, such as silicon oxide, silicon nitride, or silicon oxynitride, etc. one embodiment, the sixth dielectric layer 204 is made of silicon oxide. Various processes may be used to form the sixth dielectric layer 204, such as a CVD process, a PVD process, an ALD process, a PLD process, or a thermal oxidation process, etc.

Figure 5:
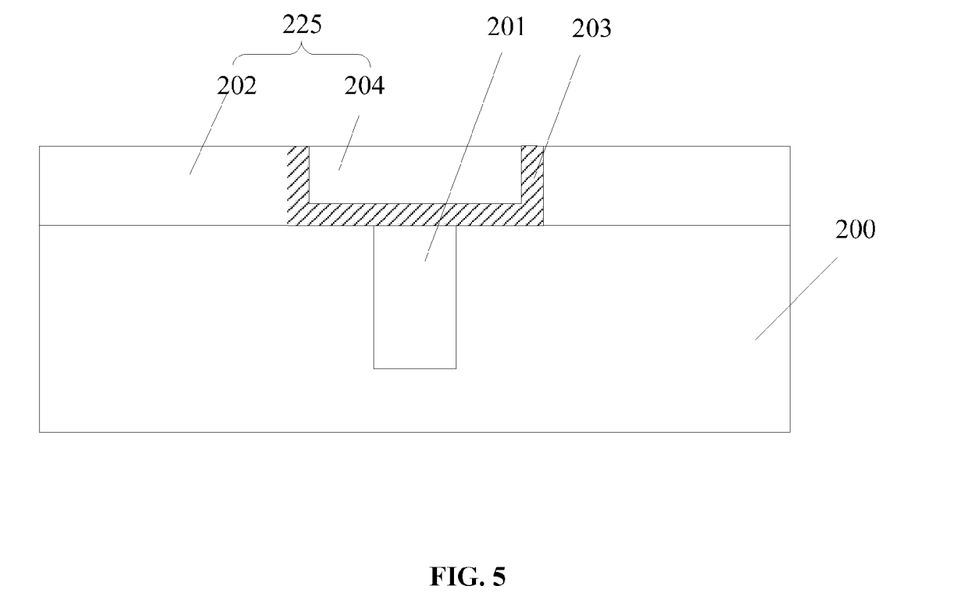

Returning to FIG. 15, after forming the loop-shape electrode material layer 223 and the sixth dielectric layer 204, a first dielectric layer and a loop-shape electrode may be formed (S104). FIG. 5 illustrates a corresponding semiconductor structure, and FIG. 6 illustrates a top view of the semiconductor structure shown in FIG. 5.

Figure 6:
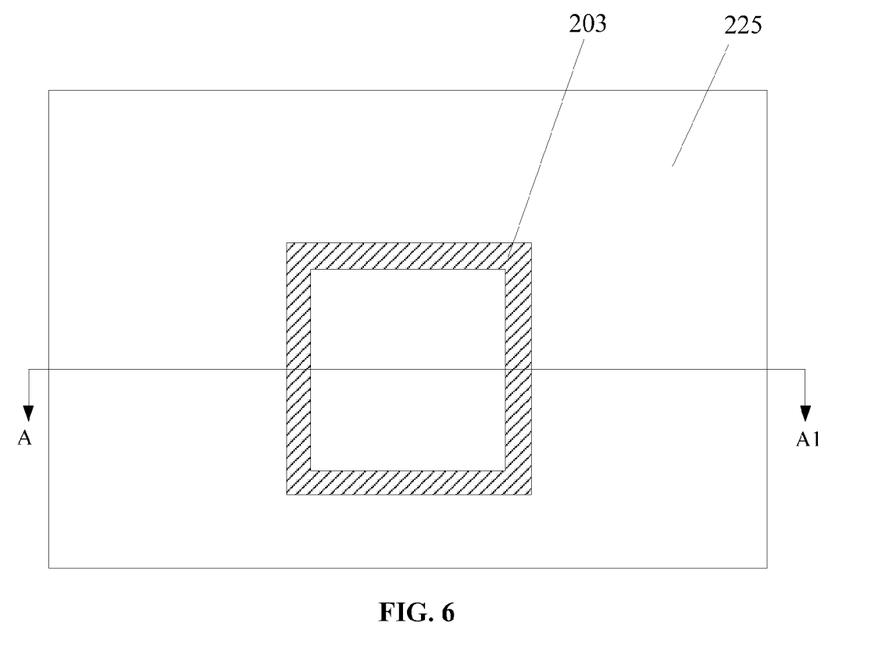

As shown in FIGS. 5-6, a first dielectric layer 225 having a portion of the fifth dielectric layer 202 and a portion of the sixth dielectric layer 204, and a loop-shape electrode 203 are formed. The first dielectric layer 225 and the loop-shape electrode 203 may be formed by polishing the sixth dielectric layer 204 and the loop-shape electrode material layer 223. Specifically, referring to FIG. 4, the sixth dielectric layer 204 and the loop-shape material layer 223 may be polished until the surface of the fifth dielectric layer 202 is exposed, that is, polished surfaces of the sixth dielectric layer 204 and the loop-shape electrode material layer 223 may level with the surface of the fifth dielectric layer 202. Therefore, a remaining portion of the sixth dielectric layer 204 and the entire fifth dielectric layer 202 form the first dielectric layer 225, and a remaining portion of the loop-shape electrode material layer 223 forms the loop-shape electrode 203. The polishing process may be a chemical process or a chemical mechanical polishing process. Other appropriate process may also be used to polish the sixth dielectric layer 204 and the loop-shape electrode material layer 223.

The loop-shape electrode 203 may have a bottom and a sidewall. The bottom of the loop-shape electrode 203 may electrically connect with the bottom electrode 201. The loop-shape electrode 203 may be embedded in the first dielectric layer 225, and a top surface of the loop-shape electrode 203 may level with a top surface of the first dielectric layer 225. A thickness of the loop-shape electrode 203 may be the thickness of the loop-shape electrode material layer 223. The thickness of the loop-shape material layer 223 may be controlled by varying parameters of a fabrication process and time. For example, the thickness of the loop-shape material layer 223 may be controlled by controlling parameters of a CVD process or MID process, and/or deposition time.

It may be rather easy to control the thickness of the loop-shape material layer 222 to be in a nanoscale region, which is much smaller than a minimum size that an existing photolithography process may be able to achieve. A contact area between the loop-shape electrode 203 and a subsequently formed phase change layer may be much smaller than a minimum size that the existing photolithography process may be able to achieve, thus the power consumption for driving a PCM may be reduced.

As shown in FIG. 6, from a top view, the shape of the loop-shape electrode 203 may be a geometric shape, such as a rectangular shape, a square shape, or a circular shape, or an irregular shape. In one embodiment, the top view of the loop-shape electrode 203 is a rectangular shape.

Figure 7:
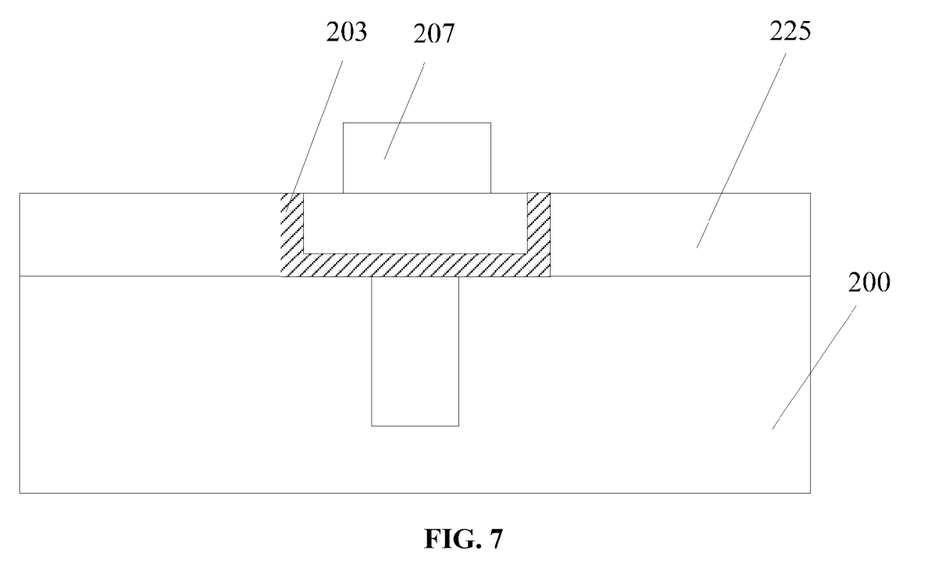

Returning to FIG. 15, after forming the first dielectric layer 225 and the loop-shape electrode 203, an isolation structure may be formed (S105). FIG. 7 illustrates a corresponding semiconductor structure, and FIG. 8 illustrates a top view of the semiconductor structure shown in FIG. 7.

Figure 8:
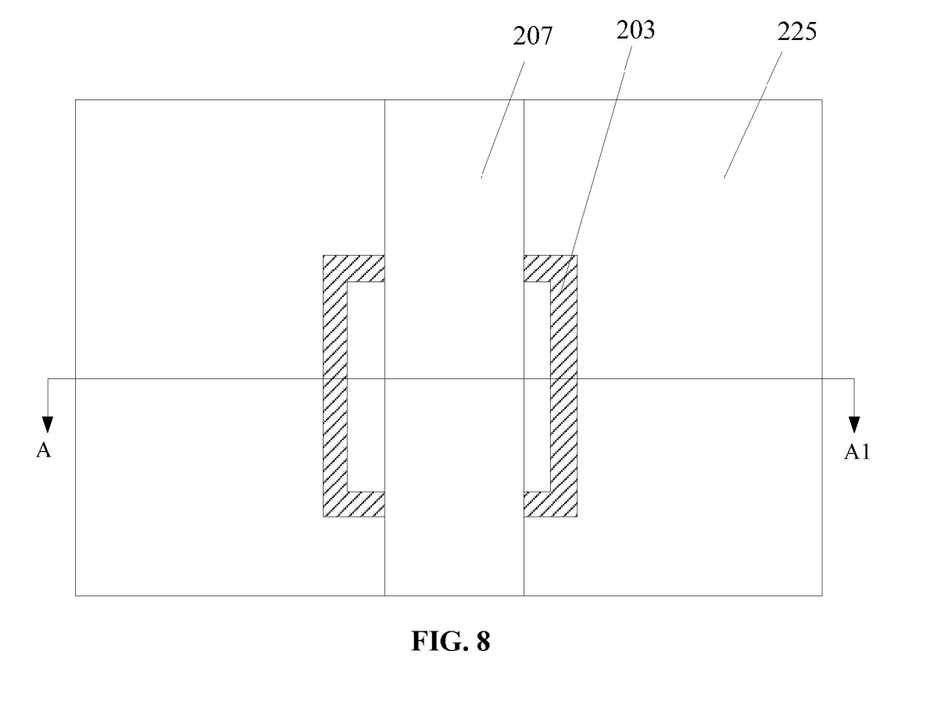

As shown in FIGS. 7-8, an isolation structure 207 is formed on first dielectric layer 225, and the isolation structure 207 may cover a portion of the loop-shape electrode 203. A method for forming the isolation structure 207 may include forming an isolation structure material layer (not shown) on the first dielectric layer 225, and forming a second photo resist pattern layer (not shown) on the isolation material layer. Patterns in the second photo resist pattern layer may cover a portion of the loop-shape electrode 203. Further, the method for forming the isolation structure 207 may include etching the isolation structure material layer using the second photo resist pattern layer as a mask until the first dielectric layer 225 is exposed, and removing the second photo resist pattern layer. Therefore, the isolation structure 207 is formed on the first dielectric layer 225, and a portion of the loop-shape electrode 203 may be covered by the isolation structure 207.

The isolation structure material layer may be made of any one of silicon oxide, silicon nitride, silicon oxynitride, or a combination thereof. Other materials may also be used to form the isolation material layer. Various processes may be used to form the isolation structure material layer, such a CVD process, a PVD process, an ALD process, a PLD process, or a thermal oxidation process, etc. The isolation structure material layer may be etched by any appropriate process to form the isolation structure 207, such as a plasma etching process, an ion beam etching process, or a etching process, etc.

The isolation structure 207 may cover a portion of the loop-shape electrode 203, thus an area of the loop-shape electrode 203 exposed by a first opening of a subsequently formed second dielectric layer may be further reduced. When a phase change layer is formed in the first opening, a contact area between the phase change layer and the loop-shape electrode 203 may be reduced too, the operation power consumption of a PCM may be further lowered.

Figure 9:
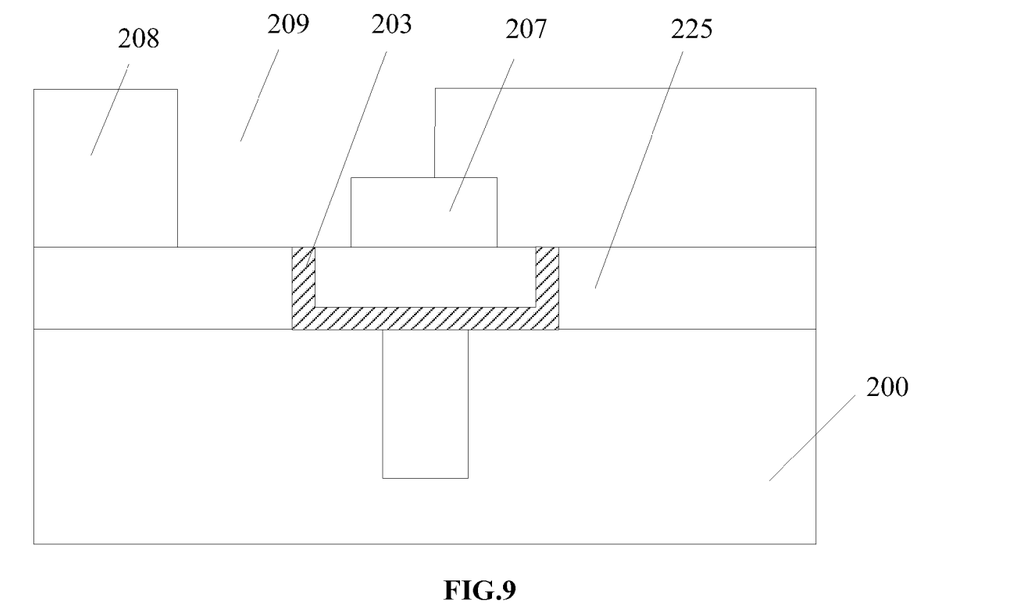

Returning to FIG. 15, after forming the isolation structure 207, a seventh dielectric layer and a first opening may be formed (S106). FIG. 9 illustrates a corresponding semiconductor structure, and FIG. 10 illustrates a top view of the semiconductor structure shown in FIG. 9.

Figure 10:
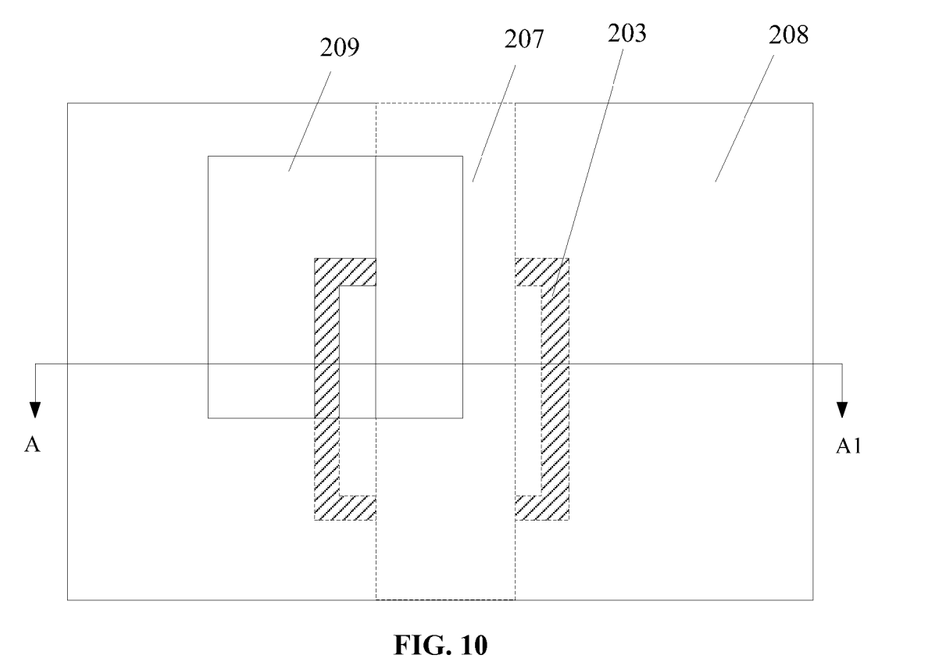

As shown in FIGS. 9-10, a seventh dielectric layer 208 having a first opening 209 is formed on the first dielectric layer 225. As shown in FIG. 10, for illustrative purposes, dash lines may be used to illustrate a portion of the isolation structure 207 covered by the seventh dielectric layer 208. The seventh dielectric layer 208 may be made of one or more of silicon oxide, silicon nitride and silicon oxynitride. Other appropriate material may also be used as the seventh dielectric layer 208.

In one embodiment, the seventh dielectric layer 208 is a stacked structure having a layer of silicon oxide and a layer of silicon nitride, and the silicon oxide layer may be on the top of the silicon nitride layer. The silicon oxide layer of the stacked structure may be used as an etching stop layer for subsequently forming the first opening, and the silicon oxide layer may prevent the loop-shape electrode 203 from being damaged.

Various processes may be used to form the seventh dielectric layer 208, such as a CVD process, a PVD process, an ALD process, a PLD process, or a thermal oxidation process. The seventh dielectric layer 208 may cover the isolation structure 207 and the loop-shape electrode 203. A chemical mechanical polishing (CMP) process may be used to flatten the seventh dielectric layer 208.

After forming the seventh dielectric layer 208, a third photo resist pattern layer (not shown) having a fifth opening may be formed on the seventh dielectric layer 208. Further, a first opening 209 may be formed in the seventh dielectric layer 208 by etching the seventh dielectric layer 208 using the third photo resist pattern layer having the fifth opening as a mask. The first opening 209 may expose a portion of the loop-shape electrode 203 and a portion of the isolation structure 207, and the third photo resist pattern layer may be subsequently removed.

Various etching processes may be used to etch the seventh dielectric layer 208, such as a plasma etching process, an ion beam etching process, or a wet etching process, etc. During the etching process for forming the first opening 209, a top width of the first opening 209 may be formed to be greater than a bottom width of the first opening 209 by controlling etching parameters. If the top width of the first opening 209 is greater than the bottom width of the first opening 209, subsequent processes for filling a phase change material, a contact metal layer and a third dielectric layer may be improved.

Referring to FIGS. 9-10, only a portion of the loop-shape electrode 203 may be exposed by the first opening 209, a subsequently formed phase change layer may only cover the portion of the loop-shape electrode 209. Therefore, the contact area between the portion of the loop-shape electrode 203 and the subsequently formed phase change layer is smaller than the surface of the loop-shape electrode 203. Thus, a volume of the subsequently formed phase change material changing phase during a phase change process may be reduced, and the operation power consumption may be lowered.

Figure 11:
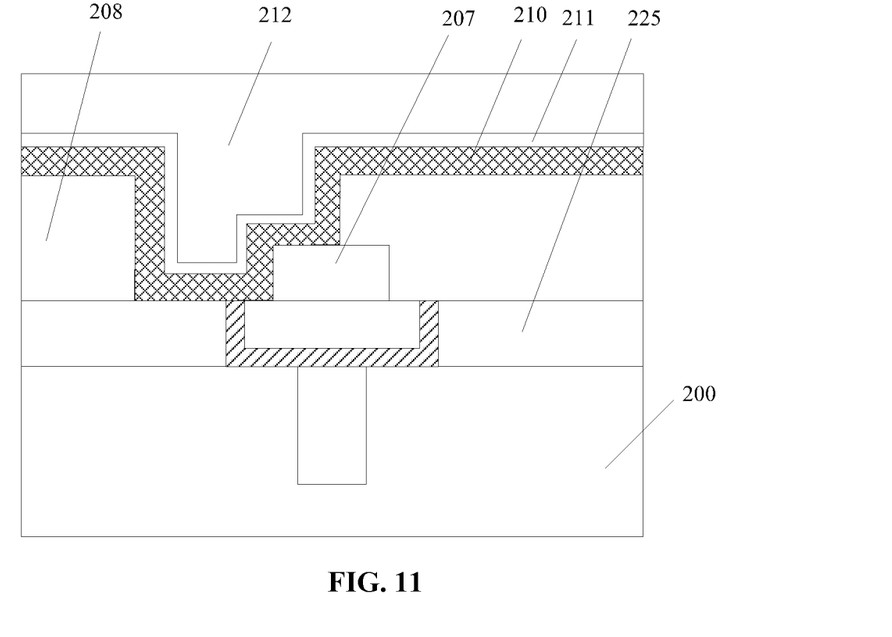

Returning to FIG. 15, after forming the first opening 209, a phase change material layer, a contact metal layer and a third dielectric layer may be formed (S107). FIG. 11 illustrates a corresponding semiconductor.

As shown in FIG. 11, a phase change material layer 210 is formed by filling the first opening 209 with a phase change material. The phase change material layer 210 may also cover the top surface of the seventh dielectric layer 208. The phase change material layer 210 may be made of any appropriate material, such as GeTe, AlSbTe, $Ge_iSb_jTe_k$, or nitrogen, oxygen carbon doped $Ge_iSb_jTe_k$, etc., where i, j, and k may refer to atomic percentages. More particularly, i may refer to an atomic percentage of Ge in the $Ge_iSb_jTe_k$; j may refer to an atomic percentage of Sb in the $Ge_iSb_jTe_k$; and k may refer to an atomic percentage of Te in the $Ge_iSb_jTe_k$, and $0 \leq i<1$; $0 \leq j<1$; $0 \leq k<1$; and $i+j+k=1$. In one embodiment, the phase change material 210 is $Ge_iSb_jTe_k$. Various deposition processes may be used to form the phase change material layer 210, such as a PVD process, a CVD process, an ALD process, a PLD process, or a flowalbe CVD process, etc.

After forming the phase change material layer 210, a contact metal layer 211 may be formed on the phase change material layer 210. The contact metal layer 211 may be made of one or more of aluminum, copper, silver, gold, platinum, nickel, titanium, thallium, tantalum, tungsten, tungsten silicide, titanium tungsten alloy, titanium nitride, thallium nitride, thallium carbide, nickel platinum alloy and thallium nitrate silicate. In one embodiment, the contact material layer 211 is made of titanium nitride.

Various deposition processes may be used to form the contact metal layer 211, such as a PVD process, a CVD process, an ALD process, a PLD process, or a flowalbe CVD process, etc. The contact metal layer 211 may reduce an atomic diffusion between the phase change material layer 210 and a subsequently formed top electrode, and improve the reliably of a PCM. The contact metal layer 211 may also reduce a thermal conductivity and a contact resistance between the phase change material layer 210 and the subsequently formed top electrode.

Further, a third dielectric layer 212 may be formed on the contact metal layer 211. The third dielectric layer 212 may be made of one or more of silicon oxide, silicon nitride, and silicon oxynitride, etc. Various deposition processes may be used to form the third dielectric layer 212, such as a PVD process, a CVD process, an ALD process, a PLD process, a flowalbe CVD (FCVD) process, or a thermal oxidation process, etc.

Additionally and optionally, before forming the phase change material layer 210, the contact metal layer 211 and the third dielectric layer 212, a transitional layer (not shown) may be filled into the first opening 209. The transitional layer may be made of any appropriate material, such as titanium nitride, titanium oxide, cerium oxide, or poly silicon, etc. Various deposition processes may be used to form the transitional layer, such as a PVD process, a CVD process, an ALD process, a PLD process, or a FCVD process. The transitional layer may often have a relatively high electrical conductivity and a relatively tow thermal conductivity, thus a joule heat generated in an interface between the phase change material layer 210 and the loop-shape electrode 203 during an operation of a PCM may be enhanced. Therefore, a heating efficiency of the phase change material layer 210 may be improved, and the operation power consumption of the PCM may be towered.

Figure 12:
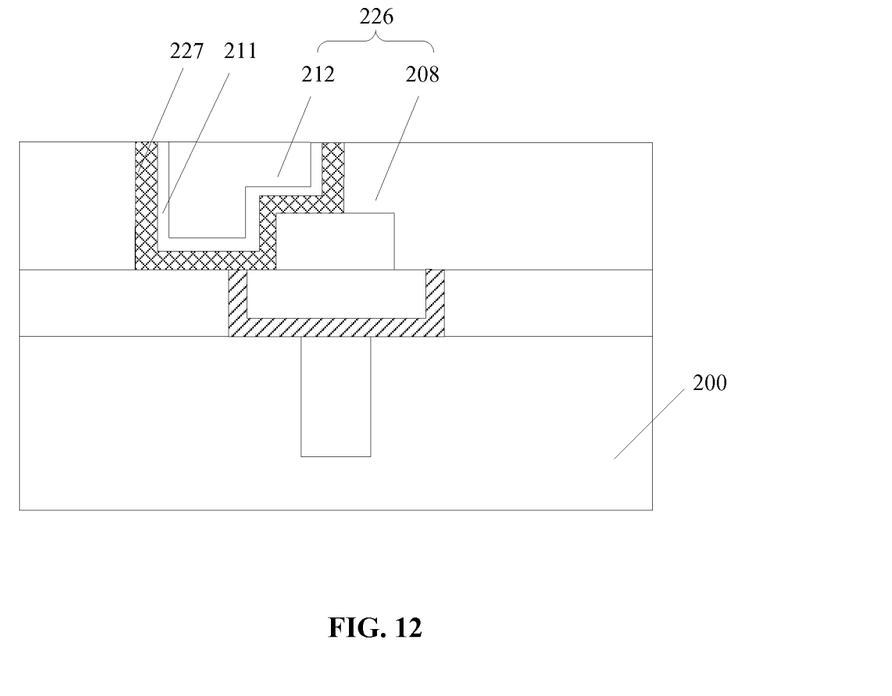

Returning to FIG. 15, after filling the phase change material layer 210, the contact metal layer 211 and the third dielectric layer 212, a phase change layer and a second dielectric layer may be formed (S108). FIG. 12 illustrates a corresponding semiconductor structure, and FIG. 13 illustrates a top view of the semiconductor structure shown in FIG. 12.

Figure 13:
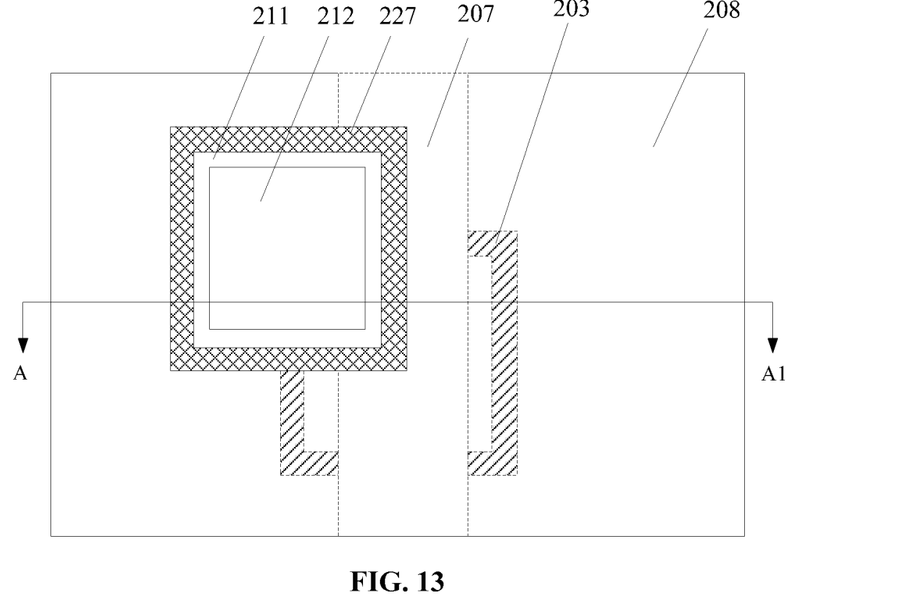

As shown in FIGS. 12-13, a phase change layer 227 is formed in the first opening 209, a portion of the third dielectric layer 212 and the first seventh dielectric layer 208 form a second dielectric layer 226. The phase change layer 227 and the second dielectric layer 226 may be formed by polishing the third dielectric layer 212, the contact metal layer 211 and the phase change material layer 210 until the surface of the seventh dielectric layer 208 is exposed.

The phase change layer 227 is formed by a remaining portion of the phase change material layer 210 in the first opening 209. The phase change layer 227 may have a bottom and a sidewall, and the bottom of the phase change layer 227 may cover a portion of the isolation structure 207 and a portion of the loop-shape electrode 203. The phase change layer 227 may be embedded in the second dielectric layer 226, and a top surface of the sidewall of the phase change layer 227 may level with a surface of the second dielectric layer 226. The second dielectric layer 226 is formed by a remaining portion of the third dielectric layer 212 and the seventh dielectric layer 208. A portion of the contact metal layer 211 remains in the first opening 209. Top views of the phase change layer 227 and the contact metal layer 211 are rectangular. The polishing process may be a mechanical polishing process or a chemical mechanical polishing process.

The isolation structure 207 and the second dielectric layer 226 may cover a portion of the loop-shape electrode 203, thus the phase change layer 227 may only contact with a portion of the loop-shape electrode 203, a contact area between the phase change layer 227 and the portion of the loop-shape electrode 203 may be smaller than the top surface of loop-shape electrode 203. A volume of the phase change material changing phase during a phase changing process may be reduced, thus the power consumption for operating a PCM may be reduced. The contact area, such as size, shape, and location relative to the loop-shape electrode 203, etc., may be controlled such that the volume of the phase change material may be desired to achieve the PCM functionalities.

Returning to FIG. 15, after forming the second dielectric layer 226 and the phase change layer 227, a top electrode and a fourth dielectric layer may be formed (S109). FIG. 14 illustrates a corresponding semiconductor structure.

As shown in FIG. 14, a top electrode 214 is formed on second dielectric layer 226, and the top electrode 214 is also in a fourth dielectric layer 213. The top electrode 214 may electrically connect with the phase change layer 227 through the contact metal layer 211. The fourth dielectric layer 213 is formed on the second dielectric layer 226, a top surface of the fourth dielectric layer 213 may level with a top surface of the top electrode 214. The fourth dielectric layer 213 may be made of any appropriate material, such as silicon oxide, silicon nitride, or silicon oxynitride, etc. Various processes may be used to form the fourth dielectric layer 213, such as a CVD process, a PVD process, an ALD process, or a PLD process, etc.

After forming the fourth dielectric layer 213, the top electrode 214 is formed in the fourth dielectric layer 213. A method for forming the top electrode 214 may include forming a fourth photo resist pattern layer (not shown) having a sixth opening on the fourth dielectric layer 213, the six opening may expose a portion of the fourth dielectric layer 213. The method may also include etching the fourth dielectric layer 213 until the contact metal layer 211 and the phase change layer 227 are exposed, and a second opening may be formed (not shown). Further, the method for forming the top electrode 214 may include removing the fourth photo resist pattern layer, and filling the second opening with a top electrode material layer.

The fourth dielectric layer 213 may be etched by any appropriate etching process, such as a plasma etching process, an ion beam etching process, or a wet etching process, etc. The top electrode material layer may be made of any appropriate material, such as aluminum, copper, silver, gold, platinum, nickel, titanium, thallium, tantalum, tungsten, tungsten suicide, titanium tungsten alloy, titanium nitride, thallium nitride, thallium carbide, nickel platinum alloy or thallium nitrate silicate. Various deposition processes may be used to form the top electrode material layer, such as a PVD process, a CVD process, an ALD process, a PLD process, or a FCVD process, etc.

Further, after forming the top electrode material layer, a polishing process may be used to polish the top electrode material layer to cause a top surface of the top electrode material layer to level with the top surface of the fourth dielectric material layer 213, thus the top electrode 214 is formed. The polishing process may be one of a mechanical polishing process and a chemical mechanical polishing process.

In certain other embodiments, the sixth opening may be corresponding to an inner bottom of the phase change layer 227. The fourth dielectric layer 213 and the second dielectric layer 226 may be both etched until an inner bottom of the contact metal layer 211 is exposed, and the second opening is formed. When the top electrode material layer is filled into the second opening, the top electrode material layer and the contact metal layer 211 may have a larger contact area, thus a contact resistance may be lowered.

Thus, a PCM may be formed by the above disclosed processes and methods, the corresponding PCM is illustrated in FIG. 14. The PCM includes the semiconductor substrate 200 having the bottom electrode 201 inside and a first dielectric layer 225 on the top surface, and the loop-shape electrode 203 in the first dielectric layer 225 electrically connecting with the bottom electrode 201. The surface of the loop-shape electrode 203 levels with the surface of the first dielectric layer 225, and an inner part of the loop-shape electrode 203 is filled with the first dielectric layer 225.

The PCM also includes the isolation structure 207 on a portion of the surface of the first dielectric layer 225 covering a portion of the loop-shape electrode 203, and the second dielectric layer 226 covering a portion of the loop-shape electrode 203 and a portion of the isolation structure 207. Further, the PCM includes the phase change layer 227 on the second dielectric layer 226 covering a portion of the loop-shape electrode 203 and a portion of the isolation structure 207, and the contact metal layer 211 on the phase change layer 227. The top surface of the phase change layer 227 levels with the surface of the second dielectric layer 226.

Further, the PCM also includes the fourth dielectric layer 213, and the top electrode 214 in the fourth dielectric layer 213 electrically connecting with the contact metal layer 211. The top surface of the top electrode 214 levels with the top surface of the fourth dielectric layer 213. The detailed structures and intermediate structures are described above with respect to the fabrication methods.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A phase change memory, comprising:
    a semiconductor substrate having a bottom electrode connecting with one or more of semiconductor devices;
    a first dielectric layer on the semiconductor substrate;
    a loop-shape electrode embedded in the first dielectric layer, a top surface of the loop-shape electrode leveling with a top surface of the first dielectric layer;
    a second dielectric layer on the first dielectric layer and the loop-shape electrode;
    a phase change layer in the second dielectric layer such that a contact area between the phase change layer and the loop-shape electrode is controlled by a thickness of the loop-shape electrode; and
    a top electrode electrically connecting with the phase change layer, wherein:
    a portion of the loop-shape electrode is covered by an isolation structure, the phase change layer is covered by a contact metal layer, and the contact metal layer is covered by a third dielectric layer.

2. The phase change memory according to claim 1, wherein:
    the second dielectric layer is a stacked layer made of silicon oxide and silicon nitride, and the silicon oxide is on top of the silicon nitride.

3. The phase change memory according to claim 1, wherein:
    the contact metal layer is made of titanium oxide.

4. The phase change memory according to claim 3, wherein:
    the second dielectric layer, the third dielectric layer, the contact metal layer and the phase change layer are covered by a fourth dielectric layer.

5. The phase change memory according to claim 3, wherein:
    a transitional layer is formed between the loop-shape electrode and the phase change layer.

6. The phase change memory according to claim 3, wherein:
    the phase change layer is made of GeSbJek, or nitrogen, oxygen or carbon doped $Ge_iSb_jTe_k$,
    wherein:
    i, j and k refer to atomic percentages, $0 \le i < 1$, $0 \le j\ 1$, $0 \le k < 1$, and $i+j+k=1$.

7. The phase change memory according to claim 1, wherein:
    the bottom electrode electrically connects with the loop shape electrode.

8. The phase change memory according to claim 1, wherein the phase change layer is embedded in the second dielectric layer, a top surface of the phase change layer leveling with a top surface of the second dielectric layer.

9. The phase change memory according to claim 8, wherein the second dielectric layer includes:

a seventh dielectric layer on the semiconductor substrate;
a first opening in the seventh dielectric layer, the first opening exposing a portion of the loop-shape electrode, the phase change layer covering a bottom and a sidewall of the first opening; and
a third dielectric layer filling the first opening, a top surface of the phase change layer leveling with a top surface of both of the seventh dielectric layer and the third dielectric layer.

10. The phase change memory according to claim 1, wherein the second dielectric layer includes:
a seventh dielectric layer on the semiconductor substrate;
a first opening in the seventh dielectric layer, the first opening exposing a portion of the loop-shape electrode and a portion of the isolation structure, the phase change layer covering the exposed portion of the loop-shape electrode and the exposed portion of the isolation structure; and
a third dielectric layer filling the first opening, a top surface of the phase change layer leveling with a top surface of both of the seventh dielectric layer and the third dielectric layer.

11. A phase change memory comprising:
a semiconductor substrate having a bottom electrode connecting with one or more of semiconductor devices;
a first dielectric layer on the semiconductor substrate;
a loop-shape electrode embedded in the first dielectric layer, a top surface of the loop-shape electrode leveling with a top surface of the first dielectric layer;
a second dielectric layer on the first dielectric layer and the loop-shape electrode:
a phase change layer in the second dielectric layer such that a contact area between the phase change layer and the loop-shape electrode is controlled by a thickness of the loop-shape electrode; and
a top electrode electrically connecting with the phase change layer,
wherein the first dielectric layer includes:
a fifth dielectric layer on the semiconductor substrate;
a third opening in the fifth dielectric layer, the loop-shape electrode covering a bottom and a sidewall of the third opening; and
a sixth dielectric layer filling the third opening, the top surface of the loop-shape electrode leveling with a top surface of both of the fifth dielectric layer and the sixth dielectric layer.

12. The phase change memory according to claim 11, wherein:
the second dielectric layer is a stacked layer made of silicon oxide and silicon nitride, and the silicon oxide is on top of the silicon nitride.

13. The phase change memory according to claim 11, wherein:
the contact metal layer is made of titanium oxide.

14. The phase change memory according to claim 13, wherein:
the second dielectric layer, the third dielectric layer, the contact metal layer and the phase change layer are covered by a fourth dielectric layer.

15. The phase change memory according to claim 13, wherein:
a transitional layer is formed between the loop-shape electrode and the phase change layer.

16. The phase change memory according to claim 13, wherein:
the phase change layer is made of $Ge_iSb_jTe_k$, or nitrogen, oxygen or carbon doped $Ge_iSb_jTe_k$,
wherein:
i, j and k refer to atomic percentages, $0 \le i < 1$, $0 \le j <$, $0 \le k < 1$, and $i+j+k=1$.

17. The phase change memory according to claim 11, wherein:
the bottom electrode electrically connects with the loop shape electrode.

18. The phase change memory according to claim 11, wherein the phase change layer is embedded in the second dielectric layer, a top surface of the phase change layer leveling with a top surface of the second dielectric layer.

19. The phase change memory according to claim 18, wherein the second dielectric layer includes:
a seventh dielectric layer on the semiconductor substrate;
a first opening in the seventh dielectric layer, the first opening exposing a portion of the loop-shape electrode, the phase change layer covering a bottom and a sidewall of the first opening; and
a third dielectric layer filling the first opening, a top surface of the phase change layer leveling with a top surface of both of the seventh dielectric layer and the third dielectric layer.

20. The phase change memory according to claim 11, wherein the second dielectric layer includes:
a seventh dielectric layer on the semiconductor substrate;
a first opening in the seventh dielectric layer, the first opening exposing a portion of the loop-shape electrode and a portion of the isolation structure, the phase change layer covering the exposed portion of the loop-shape electrode and the exposed portion of the isolation structure; and
a third dielectric layer filling the first opening, a top surface of the phase change layer leveling with a top surface of both of the seventh dielectric layer and the third dielectric layer.

* * * * *